US012772619B2

(12) United States Patent
Bang et al.

(10) Patent No.: US 12,772,619 B2
(45) Date of Patent: Oct. 20, 2026

(54) DISPLAY DEVICE AND METHOD OF MANUFACTURING THE SAME

(71) Applicant: Samsung Display Co., Ltd., Yongin-Si (KR)

(72) Inventors: Jiyoung Bang, Yongin-si (KR); Dongseong Koo, Yongin-si (KR); Dogi Lim, Yongin-si (KR); Minsoo Seol, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 328 days.

(21) Appl. No.: 18/237,419

(22) Filed: Aug. 24, 2023

(65) Prior Publication Data

US 2024/0243229 A1 Jul. 18, 2024

(30) Foreign Application Priority Data

Jan. 16, 2023 (KR) ........................ 10-2023-0005936

(51) Int. Cl.

| | |
|---|---|
| ***H10H 20/831*** | (2025.01) |
| ***H10H 20/01*** | (2025.01) |
| ***H10H 20/857*** | (2025.01) |
| ***H10W 90/00*** | (2026.01) |

(52) U.S. Cl.

CPC ........ *H10H 20/831* (2025.01); *H10H 20/857* (2025.01); *H10W 90/00* (2026.01); *H10H 20/032* (2025.01); *H10H 20/0364* (2025.01)

(58) Field of Classification Search

CPC .............. H01L 25/0753; H01L 25/167; H10H 20/831; H10H 20/857; H10K 59/122

See application file for complete search history.

(56) References Cited

U.S. PATENT DOCUMENTS

| | | | | |
|---|---|---|---|---|
| 9,530,980 | B2 | 12/2016 | Oh et al. | |
| 10,096,671 | B2 * | 10/2018 | Oh | H10K 59/1315 |
| 10,770,681 | B2 * | 9/2020 | Lee | H10K 59/8722 |
| 11,864,414 | B2 * | 1/2024 | Hirai | H10K 59/40 |
| 2014/0183479 | A1 * | 7/2014 | Park | H10K 59/1315 438/34 |
| 2016/0240810 | A1 * | 8/2016 | Oh | H10K 59/121 |
| 2018/0269261 | A1 * | 9/2018 | Park | H10K 59/873 |
| 2020/0119126 | A1 | 4/2020 | Jo et al. | |

(Continued)

FOREIGN PATENT DOCUMENTS

| | | | |
|---|---|---|---|
| JP | 2020-113421 | A | 7/2020 |
| KR | 10-1900501 | B1 | 9/2018 |

(Continued)

OTHER PUBLICATIONS

PCT/KR2024/000637, PCT-Search-Report dated on Apr. 24, 2024, 3 pages.

*Primary Examiner* — Steven M Page

(74) *Attorney, Agent, or Firm* — Innovation Counsel LLP

(57) ABSTRACT

A display device comprises a first lower pattern disposed in a first area and disposed in a same layer as an emission lower electrode, a second lower pattern disposed in a second area adjacent to the first area and disposed in a same layer as the first lower pattern, and an upper electrode disposed on the second lower pattern, contacting the first lower pattern in the first area, and overlapping the second lower pattern in the second area not to contact the second lower pattern.

19 Claims, 13 Drawing Sheets

(56) References Cited

U.S. PATENT DOCUMENTS

| | | | | |
|---|---|---|---|---|
| 2020/0287157 | A1* | 9/2020 | Seong | H10K 59/873 |
| 2022/0115625 | A1* | 4/2022 | Yu | H10K 59/131 |

FOREIGN PATENT DOCUMENTS

| | | | |
|---|---|---|---|
| KR | 10-1934787 | B1 | 3/2019 |
| KR | 10-2020-0040965 | A | 4/2020 |
| KR | 10-2022-0091133 | A | 6/2022 |
| KR | 10-2022-0148139 | A | 11/2022 |
| KR | 10-2487496 | B1 | 1/2023 |

* cited by examiner

DISPLAY DEVICE AND METHOD OF MANUFACTURING THE SAME

This application claims priority to Korean Patent Application No. 10-2023-0005936, filed on Jan. 16, 2023, and all the benefits accruing therefrom under 35 U.S.C. § 119, the content of which in its entirety is herein incorporated by reference.

BACKGROUND

1. Field

Implementations of the inventive concept relate generally to a display device.

2. Discussion of the Background

A display device includes an upper electrode (e.g., a cathode electrode) implemented as a plate electrode, and the upper electrode is formed in a display area and a peripheral area adjacent to the display area. The upper electrode formed in the display area may apply a voltage to an emission layer together with a lower electrode. The upper electrode formed in the peripheral area may receive a voltage from the outside.

The upper electrode may contact a lower pattern formed in the peripheral area to receive the voltage provided from a the lower pattern disposed in the peripheral area. Accordingly, the lower pattern formed in the peripheral area is exposed during the manufacturing process of the display device. However, in the process of forming the upper electrode, as the mask directly contacts the lower pattern, a peeling defect of the upper electrode may occur, and thus, the yield of the display device may decrease.

SUMMARY

Embodiments provide a display device with improved yield.

Embodiments provide a method of manufacturing the display device.

A display device according to an embodiment may include an emission lower electrode disposed in a display area on a substrate, a first lower pattern disposed in a first area adjacent to the display area and disposed in a same layer as the emission lower electrode, a second lower pattern disposed in a second area adjacent to the first area and disposed in a same layer as the first lower pattern, and an upper electrode disposed on the first lower pattern and the second lower pattern, contacting the first lower pattern in the first area, and overlapping the second lower pattern in the second area.

In an embodiment, the upper electrode may not contact the second lower pattern.

In an embodiment, the display device may further include a pixel defining layer disposed on the first lower pattern and the second lower pattern, and the pixel defining layer may not include an opening in an area overlapping the second lower pattern.

In an embodiment, the pixel defining layer may entirely cover the second lower pattern.

In an embodiment, the pixel defining layer includes an opening disposed in an area corresponding to the first lower pattern in a plan view.

In an embodiment, the pixel defining layer may include an opening disposed in an area corresponding to the emission lower electrode in a plan view, and an emission layer may be disposed between the emission lower electrode and the upper electrode.

In an embodiment, the emission lower electrode, the first lower pattern, and the second lower pattern may have a same shape as each other.

In an embodiment, the display device may further include a dam structure disposed in a non-display area adjacent to the second area, the second lower pattern may be disposed between the first lower pattern and the dam structure.

In an embodiment, the display device may further include a first inorganic layer disposed on the upper electrode, an organic layer disposed on the first inorganic layer, and a second inorganic layer disposed on the organic layer.

In an embodiment, the display device may further include a transistor disposed under the emission lower electrode. The transistor may include a lower metal pattern disposed on the substrate, an active pattern disposed on the lower metal pattern, a gate electrode disposed on the active pattern, and a connection electrode disposed on the gate electrode. The emission lower electrode may be electrically connected to the active pattern through the connection electrode.

A method of manufacturing a display device according to an embodiment may include forming an emission lower electrode in a display area on a substrate, forming an emission lower electrode in a display area on a substrate, a first lower pattern in a first area disposed adjacent to the display area, and a second lower pattern in a second area disposed adjacent to the first area, and forming an upper electrode on the first lower pattern and the second lower pattern, contacting the first lower pattern in the first area, and overlapping the second lower pattern in the second area.

In an embodiment, the method may further include forming a preliminary pixel defining layer covering the first lower pattern and the second lower pattern and patterning the preliminary pixel defining layer using a first mask to expose the first lower pattern.

In an embodiment, the preliminary pixel defining layer overlapping the second area may not be removed while the preliminary pixel defining layer is being patterned.

In an embodiment, the first mask may include a blocking portion entirely overlapping the second area.

In an embodiment, the first mask may further include a pattern portion overlapping the first area and an open portion overlapping the non-display area, and the blocking portion may be disposed between the pattern portion and the open portion.

In an embodiment, the display device may further include forming an emission layer on the first lower pattern using a second mask. The upper electrode may be formed using a third mask, and the second area may correspond to an alignment margin area of the third mask.

In an embodiment, the preliminary pixel defining layer may be patterned to expose the emission lower electrode using the first mask In an embodiment, the method may further include forming a first inorganic layer disposed on the upper electrode, forming an organic layer on the first inorganic layer, and forming a second inorganic layer on the organic layer.

In an embodiment, the method may further include forming a lower metal pattern on the substrate, forming an active pattern on the lower metal pattern, forming a gate electrode on the active pattern, and forming a connection electrode on the gate electrode.

In an embodiment, the upper electrode may not contact the second lower pattern.

Therefore, a display device according to example embodiments of the present invention may include an emission lower electrode, a first lower pattern, a second lower pattern, and an upper electrode. The first lower pattern disposed in the first area may be connected to the upper electrode and may transmit a voltage to the upper electrode. The second lower pattern disposed in the second area adjacent to the first area may be entirely covered by the pixel defining layer, may overlap the upper electrode, and may be disconnected from the upper electrode. Accordingly, in the process of forming the upper electrode, the mask may not directly contact the second lower pattern, and a peeling defect of the upper electrode overlapping the second area may be prevented.

BRIEF DESCRIPTION OF THE DRAWINGS

The accompanying drawings, which are included to provide a further understanding of the inventive concept and are incorporated in and constitute a part of this specification, illustrate embodiments of the inventive concept together with the description.

DETAILED DESCRIPTION

Illustrative, non-limiting embodiments will be more clearly understood from the following detailed description in conjunction with the accompanying drawings.

Figure 1:
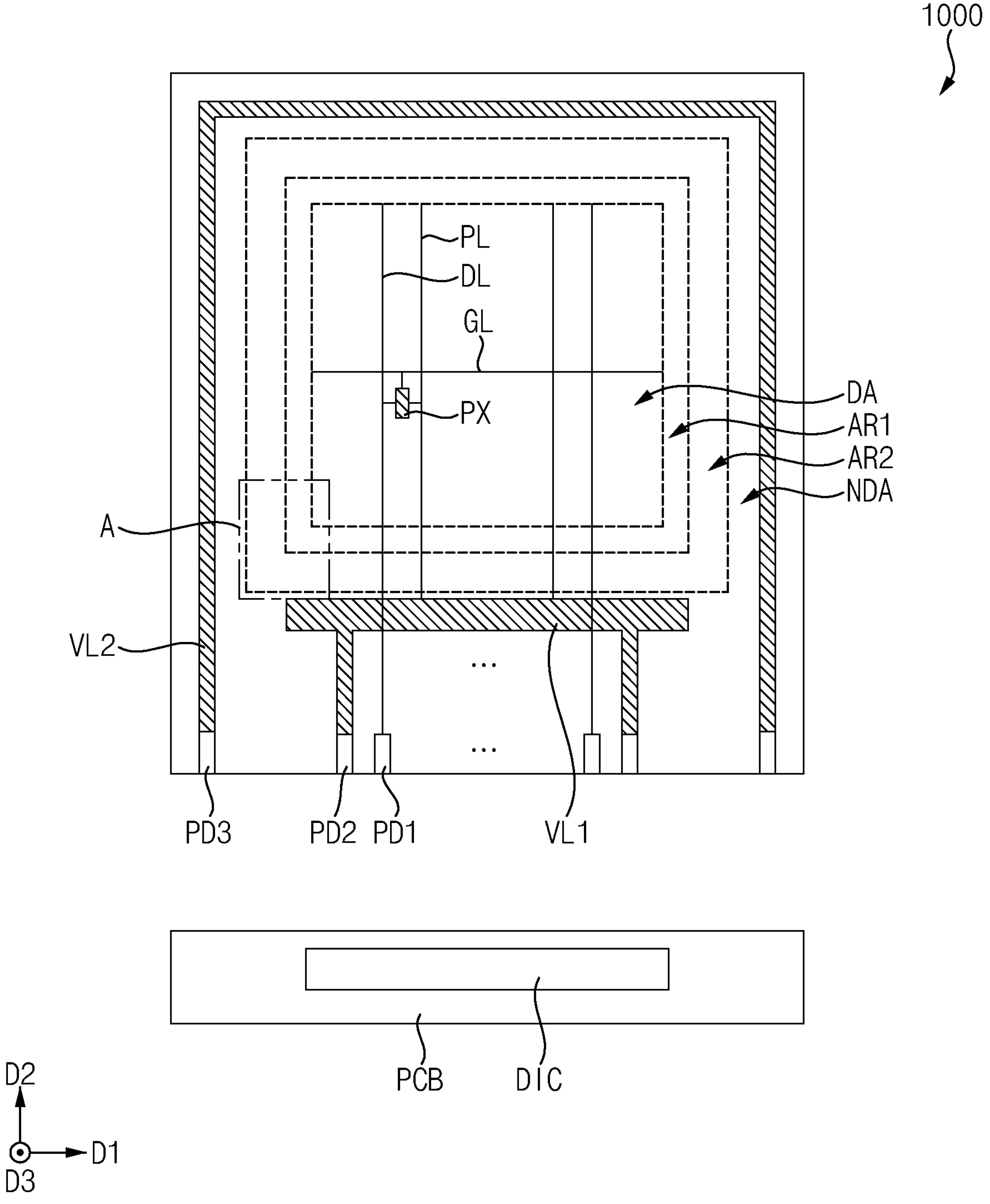
FIG. 1 is a plan view illustrating a display device according to an embodiment of the present invention.

FIG. 1 is a plan view illustrating a display device according to an embodiment of the present invention.

Referring to FIG. 1, a display device 1000 according to an embodiment of the present invention may include a display area DA, a first area AR1, a second area AR2, and a non-display area NDA.

The display area DA may have various shapes such as a circular shape and a polygonal shape, and for example, may have a rectangular shape as shown in FIG. 1. A pixel PX may be disposed in the display area DA, and an image may be displayed in the display area DA.

The first area AR1 may be disposed adjacent to the display area DA and may surround at least a portion of the display area DA. For example, metal patterns disposed in the first area AR1 may electrically connect metal patterns disposed in the display area DA and metal patterns disposed in the non-display area NDA.

The second area AR2 may be disposed adjacent to the first area AR1 and may surround at least a portion of the first area AR1. For example, the second area AR2 may be a margin area between the first area AR1 and the non-display area NDA.

The non-display area NDA may be disposed adjacent to the second area AR2 and may surround at least a portion of the second area AR2. Various lines for driving the display area DA may be disposed in the non-display area NDA.

An image may be displayed in the display area DA. In an embodiment, at least one pixel PX may be disposed in the display area DA.

The pixel PX may be electrically connected to a data line DL, a driving voltage line PL, and a gate line GL.

The gate driver (not shown) may be disposed on at least one side (e.g., left side and/or right side) of the display device 1000. The gate driver may receive a clock signal from a clock line. The gate driver may generate a first gate signal (e.g., a first gate signal SC of FIG. 2) and a second gate signal (e.g., a second gate signal SS of FIG. 2) based on the clock signal. The first gate signal SC and the second gate signal SS may be provided to the pixel PX through the gate line GL.

In an embodiment, a first pad PD1, a second pad PD2, a third pad PD3, a first voltage line VL1, and a second voltage line VL2 may be disposed in the non-display area NDA. In addition, various lines, drivers, patterns, etc. for driving the display area DA may be further disposed in the non-display area NDA.

In an embodiment, the first to third pads PD1, PD2, and PD3 may be disposed in the non-display area NDA disposed adjacent to the lower side of the display area DA. The first to third pads PD1, PD2, and PD3 may receive signals and/or voltages from a printed circuit board PCB.

The first pad PD1 may receive a data voltage (e.g., a data voltage DATA of FIG. 2) from a data driver DIC. The data voltage DATA may be provided to the pixel PX through the data line DL.

Figure 2:
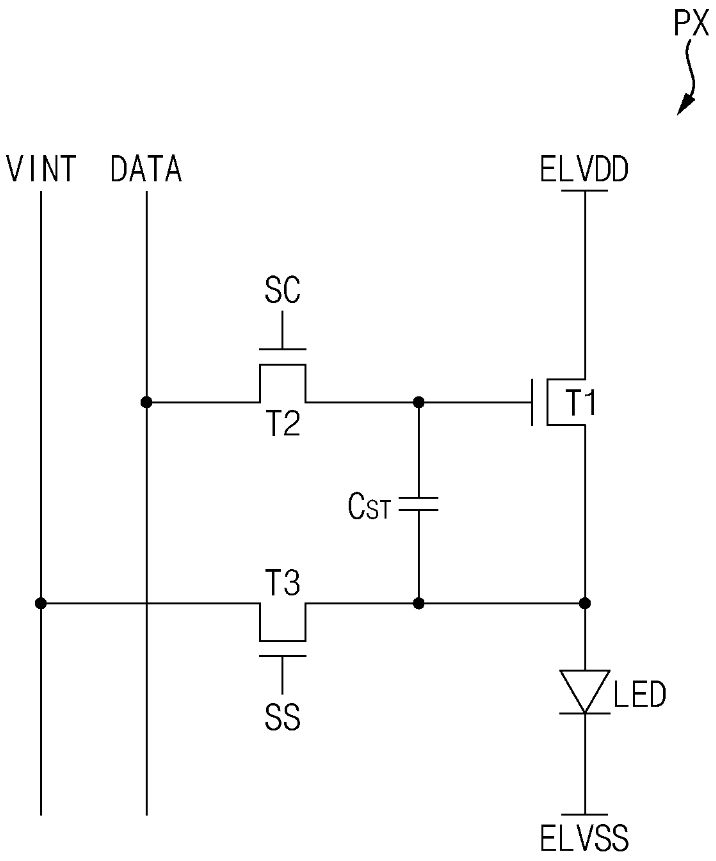
FIG. 2 is a circuit diagram illustrating a pixel included in the display device of FIG. 1.

The second pad PD2 may receive a first voltage (e.g., a first voltage ELVDD of FIG. 2). The first voltage ELVDD may be provided to the pixel PX through the first voltage line VL1 and the driving voltage line PL.

The third pad PD3 may receive a second voltage (e.g., a second voltage ELVSS of FIG. 2). The second voltage ELVSS may be provided to the pixel PX through an upper electrode (e.g., an upper electrode CTE of FIG. 3).

The second voltage line VL2 may be disposed to surround the second area AR2. The second voltage ELVSS may be applied to the second voltage line VL2, and the second voltage ELVSS may be applied to the upper electrode CTE through a first lower pattern (e.g., a first lower pattern ADE1 of FIG. 4) disposed in the first area AR1.

FIG. 2 is a circuit diagram illustrating a pixel included in the display device of FIG. 1.

Referring to FIG. 2, the pixel PX may include a first transistor T1, a second transistor T2, a third transistor T3, a storage capacitor CST, and a light emitting diode LED.

The first transistor T1 may include a first terminal, a second terminal, and a gate terminal. The first terminal may receive the first voltage ELVDD. The second terminal may be connected to the light emitting diode LED. The gate terminal may be connected to the second transistor T2. The first transistor T1 may generate a driving current based on the first voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first gate signal SC. The second transistor T2 may transfer the data voltage DATA to a node in which the gate terminal of the first transistor T1 is connected in response to the first gate signal SC.

The third transistor T3 may include a first terminal, a second terminal, and a gate terminal. The first terminal may be connected to the first transistor T1. The second terminal may receive an initialization voltage VINT. The gate terminal may receive the second gate signal SS. The third transistor T3 may transmit the initialization voltage VINT to the second terminal of the first transistor T1 in response to the second gate signal SS.

The storage capacitor CST may include a first terminal and a second terminal. The first terminal may be connected to the gate terminal of the first transistor T1. The second terminal may be connected to the first terminal of the third transistor T3. The storage capacitor CST may maintain a voltage level of the gate terminal of the first transistor T1 during an inactive period of the first gate signal SC.

The light emitting diode LED may include a first terminal and a second terminal. The first terminal may be connected to the second terminal of the first transistor T1. The second terminal may receive the second voltage ELVSS. The light emitting diode LED may emit light having luminance corresponding to the driving current. The light emitting diode LED may include an organic light emitting diode using an organic material as an emission layer, an inorganic light emitting diode using an inorganic material as an emission layer, and/or the like.

Figure 3:
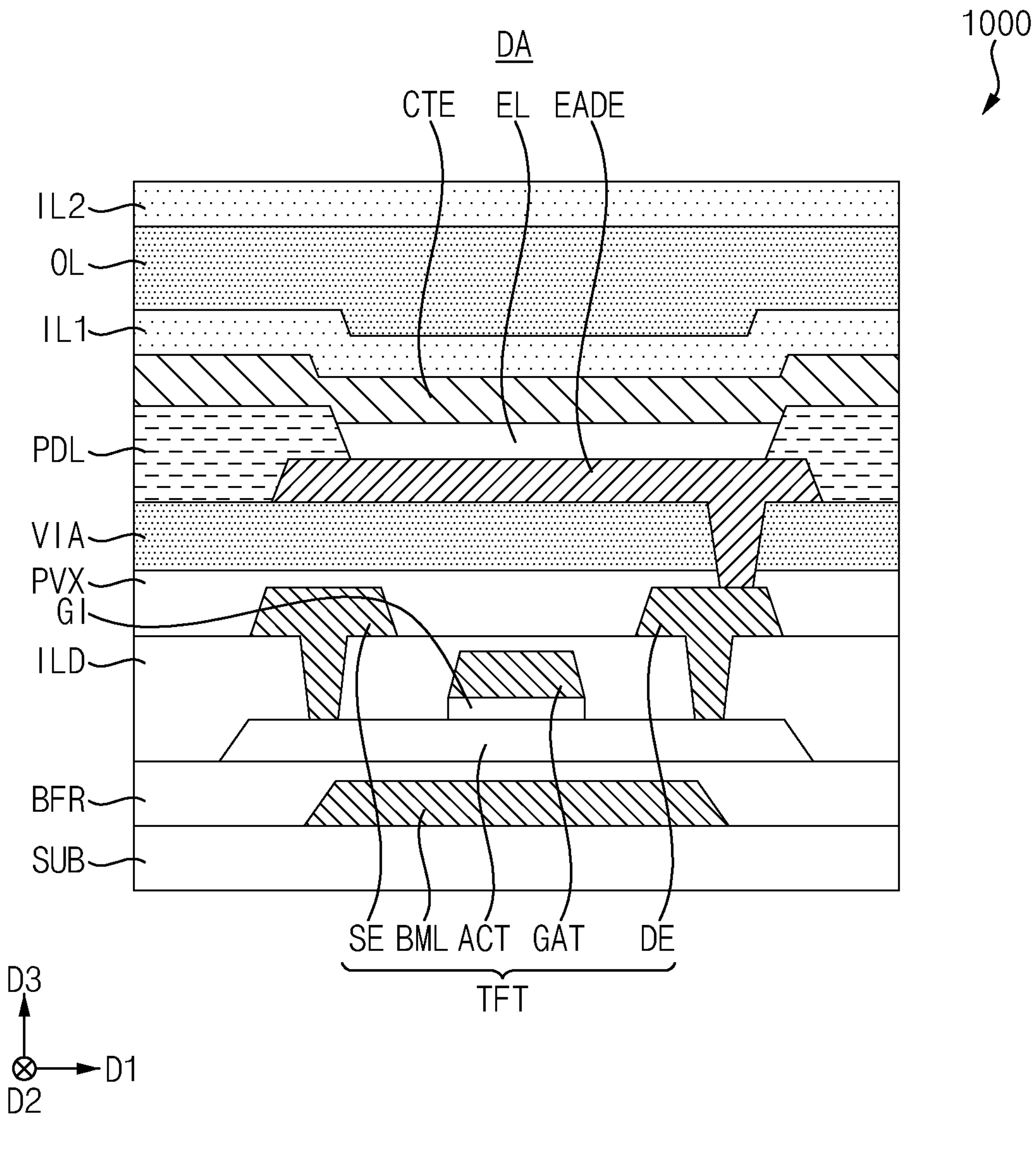
FIG. 3 and FIG. 4 are cross-sectional views illustrating the display device of FIG. 1.
Figure 4:
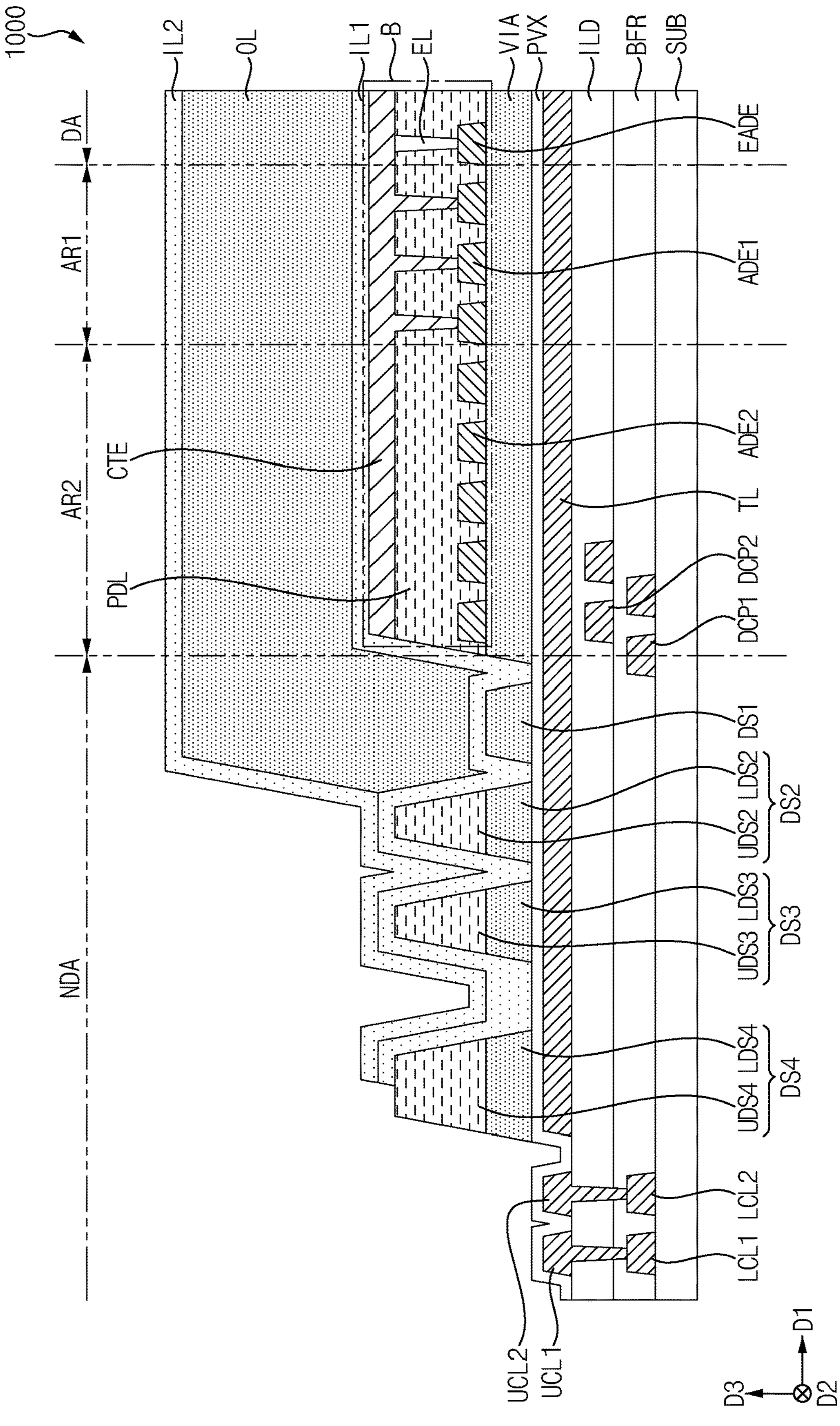
Figure 5:
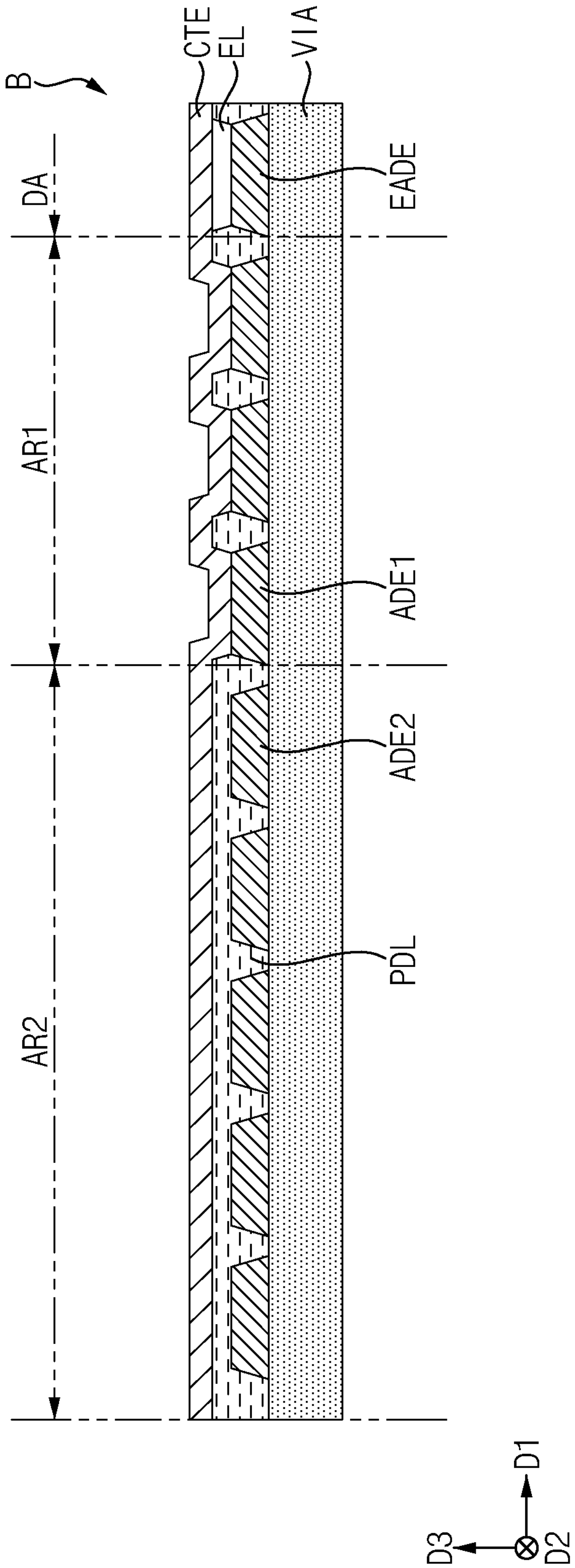
FIG. 5 is an enlarged view of area B of FIG. 4.

FIG. 3 and FIG. 4 are cross-sectional views illustrating the display device of FIG. 1. FIG. 5 is an enlarged view of area B of FIG. 4.

Referring to FIG. 3, a substrate SUB may include a transparent or opaque material. In an embodiment, examples of materials that can be used as the substrate SUB may include glass, quartz, plastic, and/or the like. These may be used alone or in combination with each other. In addition, the substrate SUB may include a single layer or multiple layers in combination with each other.

A lower metal pattern BML may be disposed on the substrate SUB. For example, the lower metal pattern BML may be formed of a metal, an alloy, a conductive metal oxide, a transparent conductive material, or the like. Examples of materials that can be used as the lower metal pattern BML may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other. In addition, the lower metal pattern BML may be formed as a single layer or as multiple layers in combination with each other.

In an embodiment, the lower metal pattern BML may receive the initialization voltage VINT. For example, the lower metal pattern BML may correspond to the second terminal of the storage capacitor CST described with reference to FIG. 2. In another embodiment, the lower metal pattern BML may receive the data voltage DATA. For example, the lower metal pattern BML may correspond to the data line DL described with reference to FIG. 1. However, the lower metal pattern BML is not limited thereto.

A buffer layer BFR may be disposed on the substrate SUB and may cover the lower metal pattern BML. In an embodiment, the buffer layer BFR may be formed of an inorganic insulating material. Examples of materials that can be used as the inorganic insulating material may include silicon oxide, silicon nitride, and/or silicon oxynitride. These may be used alone or in combination with each other. The buffer layer BFR may prevent diffusion of atoms, for example, metal atoms, or impurities from the substrate SUB into an active pattern ACT. In addition, the buffer layer BFR may control a heat transfer rate during a crystallization process for forming the active pattern ACT.

The active pattern ACT may be disposed on the buffer layer BFR. In an embodiment, the active pattern ACT may be formed of a silicon semiconductor material or an oxide semiconductor material. Examples of the silicon semiconductor material that can be used as the active pattern ACT may include amorphous silicon and polycrystalline silicon. Examples of the oxide semiconductor material that can be used as the active pattern ACT may include InGaZnO ("IGZO") and InSnZnO ("ITZO"). In addition, the oxide semiconductor material may further include indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and/or zinc ("Zn"). These may be used alone or in combination with each other.

A gate insulating layer GI may be disposed on the buffer layer BFR and may cover the active pattern ACT. In an embodiment, the gate insulating layer GI may be formed of an insulating material. Examples of an insulating material that can be used as the gate insulating layer GI may include silicon oxide, silicon nitride, and/or silicon oxynitride. These may be used alone or in combination with each other.

A gate electrode GAT may be disposed on the gate insulating layer GI. In an embodiment, the gate electrode GAT may be formed of metal, metal alloy, conductive metal oxide, transparent conductive material, or the like. For example, the gate electrode GAT may correspond to the gate terminal of the first transistor T1 described with reference to FIG. 2.

An interlayer insulating layer ILD may be disposed on the buffer layer BFR and the gate insulating layer GI. The interlayer insulating layer ILD may cover the gate electrode GAT. In an embodiment, the interlayer insulating layer ILD may be formed of an insulating material. Examples of insulating materials that can be used as the interlayer insulating layer ILD may include silicon oxide, silicon nitride, and/or silicon oxynitride. These may be used alone or in combination with each other.

A first connection electrode SE and a second connection electrode DE may be disposed on the interlayer insulating layer ILD. For example, the first connection electrode SE and the second connection electrode DE may be formed of a metal, a metal alloy, a conductive metal oxide, a transparent conductive material, and/or the like.

In an embodiment, the first connection electrode SE and the second connection electrode DE may contact the active pattern ACT. Accordingly, the lower metal pattern BML, the active pattern ACT, the gate electrode GAT, the first connection electrode SE, and the second connection electrode DE may constitute a transistor TFT. In another embodiment, the lower metal pattern BML may be omitted, and the active pattern ACT, the gate electrode GAT, the first connection electrode SE, and the second connection electrode DE may constitute a transistor TFT.

A passivation layer PVX may be disposed on the interlayer insulating layer ILD. In an embodiment, the passivation layer PVX may be formed of an inorganic insulating material. Examples of inorganic insulating materials that can be used as the passivation layer PVX may include silicon oxide, silicon nitride, and/or silicon oxynitride. These may be used alone or in combination with each other.

A via insulation layer VIA may be disposed on the passivation layer PVX. In an embodiment, the via insulation layer VIA may include an organic material. Examples of organic materials that can be used as the via insulation layer VIA may include photoresist, polyacrylic resin, polyimide resin, and/or acrylic resin. These may be used alone or in combination with each other.

In another embodiment, the passivation layer PVX may be omitted. In this case, the via insulating layer VIA may include an organic material and an inorganic material. Examples of materials that can be used as the via insulation layer VIA may include photoresist, polyacrylic resin, polyimide resin, acrylic resin, silicon oxide, silicon nitride, and/or silicon oxynitride. These may be used alone or in combination with each other.

The via insulation layer VIA may overlap the display area DA. The via insulation layer VIA may provide a flat upper surface on which the emission lower electrode EADE is formed.

The emission lower electrode EADE may be disposed on the via insulating layer VIA. In an embodiment, the emission lower electrode EADE may be electrically connected to the transistor TFT through the second connection electrode DE. In another embodiment, the emission lower electrode EADE may be connected to the first connection electrode SE. In still another embodiment, the emission lower electrode EDE may be connected to the lower metal pattern BML through the first connection electrode SE.

The emission lower electrode EADE may be formed of a metal, a metal alloy, a conductive metal oxide, a transparent conductive material, and/or the like. Examples of materials that can be used as the emission lower electrode EADE may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("Ti"), tantalum ("Ta"), platinum ("Pt"), scandium ("Sc"), indium tin oxide ("ITO"), indium zinc oxide ("IZO"), and/or the like. These may be used alone or in combination with each other.

In addition, the emission lower electrode EADE may be composed of a single layer or multiple layers in combination with each other. For example, the emission lower electrode EADE may have an ITO/Ag/ITO structure.

A pixel defining layer PDL may be disposed on the via insulating layer VIA. The pixel defining layer PDL may include an organic material. Examples of organic materials that can be used as the pixel defining layer PDL may include photoresist, polyacrylic resin, polyimide resin, and/or acrylic resin. These may be used alone or in combination with each other.

An opening for forming an emission layer EL may be defined in the pixel defining layer PDL in the display area DA.

The emission layer EL may be disposed on the emission lower electrode EADE. The upper electrode CTE may be disposed on the emission layer EL. The emission layer EL may emit light based on a voltage difference between the emission lower electrode EADE and the upper electrode CTE.

A first inorganic layer IL1 may be disposed on the upper electrode CTE. In an embodiment, the first inorganic layer IL1 may be formed of an inorganic material. Examples of inorganic materials that can be used as the first inorganic layer IL1 may include silicon oxide, silicon nitride, and/or silicon oxynitride. These may be used alone or in combination with each other.

An organic layer OL may be disposed on the first inorganic layer ILL. In an embodiment, the organic layer OL may include an organic material. Examples of organic materials that can be used as the organic layer OL may include photoresist, polyacrylic resin, polyimide resin, and/or acrylic resin. These may be used alone or in combination with each other.

A second inorganic layer IL2 may be disposed on the organic layer OL. The second inorganic layer IL2 may be formed of an inorganic material, and may include, for example, the same material as the first inorganic layer ILL.

Referring to FIGS. 4 and 5, a first driving circuit pattern DCP1, a first lower clock line LCL1, and a second lower clock line LCL2 may be disposed on the substrate SUB. In an embodiment, the first driving circuit pattern DCP1, the first lower clock line LCL1, and the second lower clock line LCL2 may be disposed in the same layer as the lower metal pattern BML and may contain the same material.

The first driving circuit pattern DCP1 may be disposed in the second area AR2 and may constitute the gate driver. The first lower clock line LCL1 and the second lower clock line LCL2 may be disposed in the non-display area NDA and may constitute the clock line. However, areas where the first driving circuit pattern DCP1, the first lower clock line LCL1, and the second lower clock line LCL2 are disposed are not limited thereto.

A second driving circuit pattern DCP2 may be disposed in the second area AR2 on the buffer layer BFR. In an embodiment, the second driving circuit pattern DCP2 may be disposed in the same layer as the gate electrode GAT and may include the same material as the gate electrode GAT. The second driving circuit pattern DCP2 may constitute the gate driver together with the first driving circuit pattern DCP1.

A transmission line TL, a first upper clock line UCL1, and a second upper clock line UCL2 may be disposed on the interlayer insulating layer ILD. In an embodiment, the transmission line TL may be electrically connected to the first connection electrode SE and/or the second connection electrode DE. The first upper clock line UCL1 may contact the first lower clock line LCL1 and the second upper clock line UCL2 may contact the second lower clock line LCL2.

A passivation layer PVX may be disposed on the transmission line TL, the first upper clock line UCL1, and the second upper clock line UCL2 to cover the transmission line TL, the first upper clock line UCL1, and the second upper clock line UCL2.

A via insulation layer VIA may be disposed on the passivation layer PVX. The via insulation layer VIA may be patterned in the non-display area NDA to form a lower structure of dam structure which will be described hereinunder.

An emission lower electrode EADE, a first lower pattern ADE1 and a second lower pattern ADE2 may be disposed on the via insulating layer VIA. In an embodiment, the first lower pattern ADE1 and the second lower pattern ADE2 may be disposed in the same layer as the emission lower electrode EADE, may include the same material, and may have the same shape.

The first lower pattern ADE1 may be disposed in the first area AR1. The first lower pattern ADE1 may be electrically connected to the second voltage line VL2 described with reference to FIG. 1. In addition, the first lower pattern ADE1 may contact the upper electrode CTE through an opening defined in the pixel defining layer PDL in the first area AR1. Accordingly, the first lower pattern ADE1 may transmit the second voltage ELVSS applied to the second voltage line VL2 to the upper electrode CTE.

The second lower pattern ADE2 may be disposed in the second area AR2. The second lower pattern ADE2 may be electrically connected to or disconnected from the first lower pattern ADE1. The second lower pattern ADE2 may be disconnected from or separated from the upper electrode CTE by the pixel defining layer PDL formed in the second area AR2.

The pixel defining layer PDL may extend to the first area AR1 and the second area AR2. At least one opening having the same shape as an opening defined in the pixel defining layer PDL in the display area DA may be defined in the pixel defining layer PDL in the first area AR1 and may expose the first lower pattern ADE1. The pixel defining layer PDL disposed in the second area AR2 may not have an opening, and the pixel defining layer PDL may entirely cover the second lower pattern ADE2.

The upper electrode CTE may extend from the display area DA to the first area AR1 and the second area AR2. The upper electrode CTE overlapping the first area AR1 may contact the first lower pattern ADE1 through the openings defined in the pixel defining layer PDL. The upper electrode CTE overlapping the second area AR2 may contact the pixel defining layer PDL and may not be connected to the second lower pattern ADE2.

In an embodiment, at least one dam structure may be disposed in the non-display area NDA to completely surround the second area AR2. For example, a first dam structure DS1, a second dam structure DS2, a third dam structure DS3, and a fourth dam structure DS4 may be disposed in the non-display area NDA. The first to fourth dam structures DS1, DS2, DS3, and DS4 may be spaced apart from each other in the first direction D1 and may extend side by side in the second direction D2. The first to fourth dam structures DS1, DS2, DS3, and DS4 may prevent the organic layer OL from flowing outside.

In an embodiment, the first dam structure DS1 may have a single-layer structure, and each of the second dam structure DS2, the third dam structure DS3, and the fourth dam structure DS4 may be a multi-layered structure including a lower structure and an upper structure.

Each of the first dam structure DS1, the second lower structure LDS2, the third lower structure LDS3, and the fourth lower structure LDS4 may be disposed in the same layer as the via insulation layer VIA and may contain the same material as the via insulation layer VIA. In addition, the second upper structure UDS2, the third upper structure UDS3, and the fourth upper structure UDS4 may be disposed on the second lower structure LDS2, the third lower structure LDS3, and the fourth upper structure UDS4, respectively. The second upper structure UDS2, the third upper structure UDS3, and the fourth upper structure UDS4 may be disposed in the same layer as the pixel defining layer PDL and may include the same material as the pixel defining layer PDL.

As the pixel defining layer PDL remains in the second area AR2 on the second lower pattern ADE2, the second lower pattern ADE2 may be entirely covered by the pixel defining layer PDL. Accordingly, in the process of forming the upper electrode CTE, the mask may not directly contact the second lower pattern ADE2, and a peeling defect of the upper electrode CTE overlapping the second area AR2 may be prevented.

Figure 6:
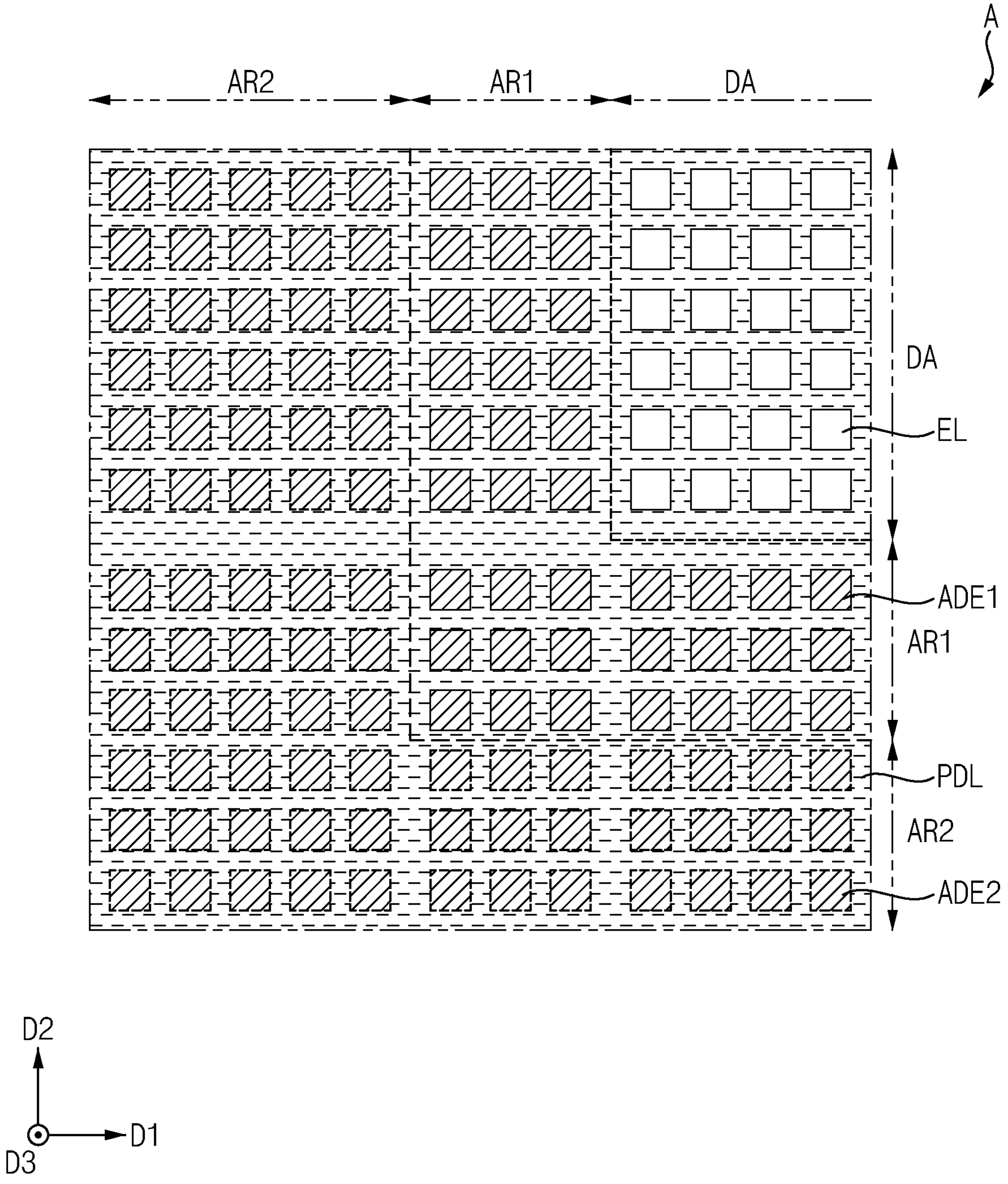
FIG. 6 is an enlarged view of area A of FIG. 1.

FIG. 6 is an enlarged view of area A of FIG. 1.

Referring to FIG. 6, as described above, the pixel defining layer PDL may be disposed in the display area DA, the first area AR1, and the second area AR2.

An opening may be defined in the pixel defining layer PDL disposed in the display area DA and the emission layer EL may disposed in the opening. An opening having the same shape as that of the display area DA may be defined in the pixel defining layer PDL disposed in the first area AR1, and the first lower pattern ADE1 exposed by the opening may contact the upper electrode CTE in the opening. An opening may not be defined in the pixel defining layer PDL disposed in the second area AR2, and the second lower pattern ADE2 may be entirely covered by the pixel defining layer PDL.

FIGS. 7 to 13 are cross-sectional views illustrating a method of manufacturing the display device of FIG. 4.

Figure 7:
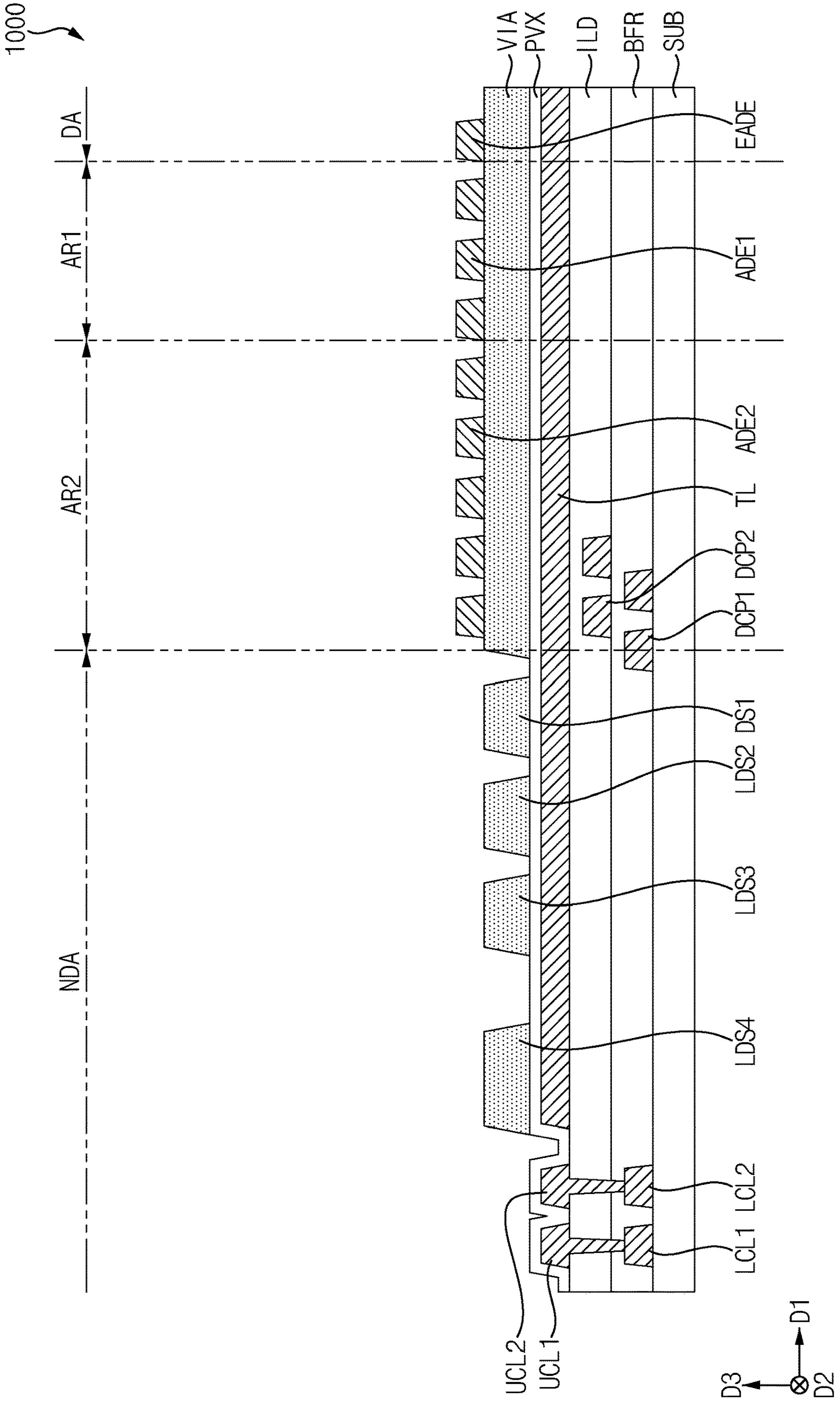
FIGS. 7, 8, 9, 10, 11, 12 and 13 are cross-sectional views illustrating a method of manufacturing the display device of FIG. 4.

Referring to FIG. 7, the emission lower electrode EADE, the first lower pattern ADE1, and the second lower pattern ADE2 may be formed together on the via insulating layer VIA. The emission lower electrode EADE, the first lower pattern ADE1, and the second lower pattern ADE2 may have the same shape, the emission lower electrode EADE may be formed in the display area DA, the first lower pattern ADE1 may be formed in the first area AR1, and the second lower pattern ADE2 may be formed in the second area AR2.

Figure 8:
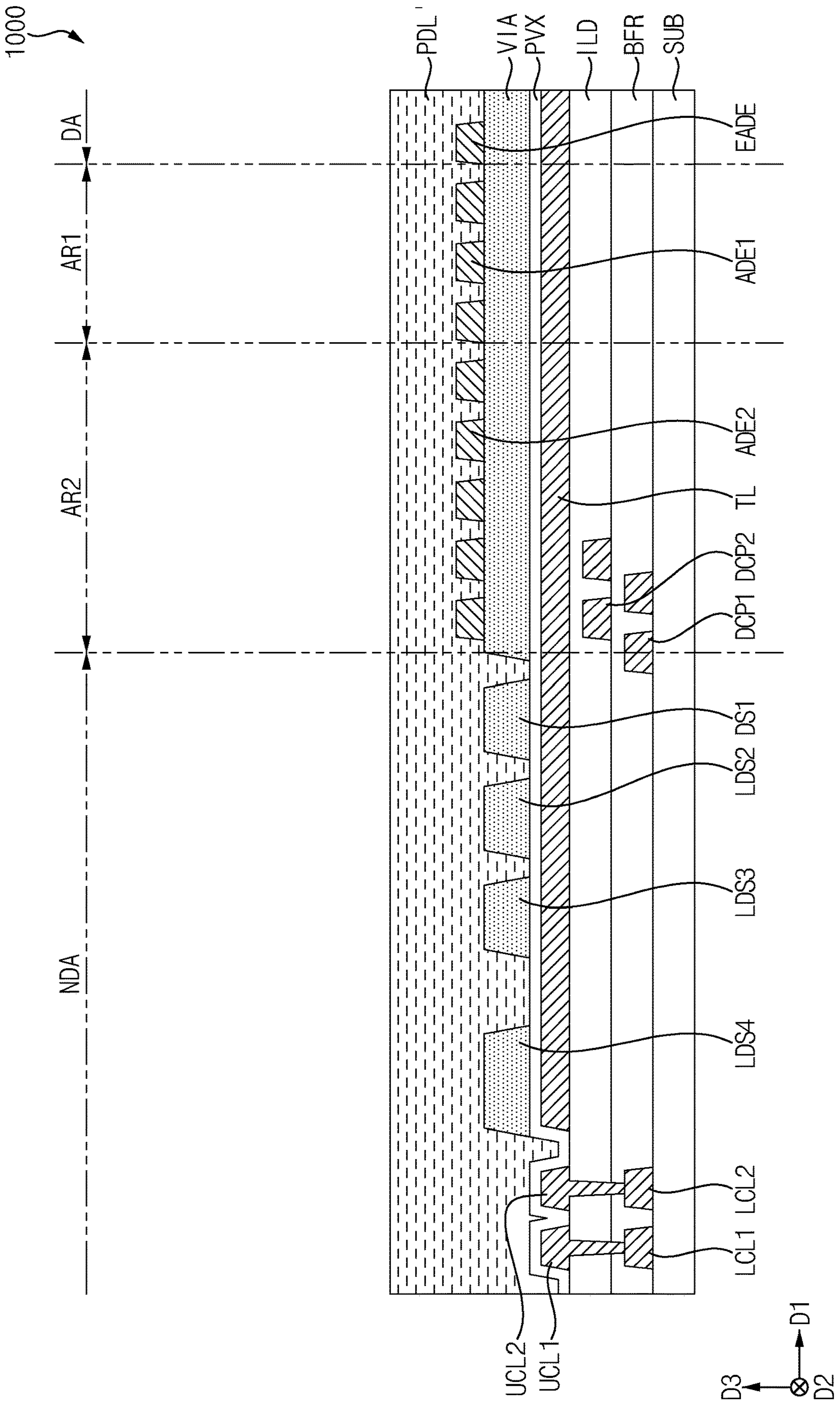

Referring to FIG. 8, a preliminary pixel defining layer PDL' may be formed in the display area DA, the first area AR1, the second area AR2, and the non-display area NDA. The preliminary pixel defining layer PDL' may cover the emission lower electrode EADE, the first lower pattern ADE1, and the second lower pattern ADE2.

Figure 9:
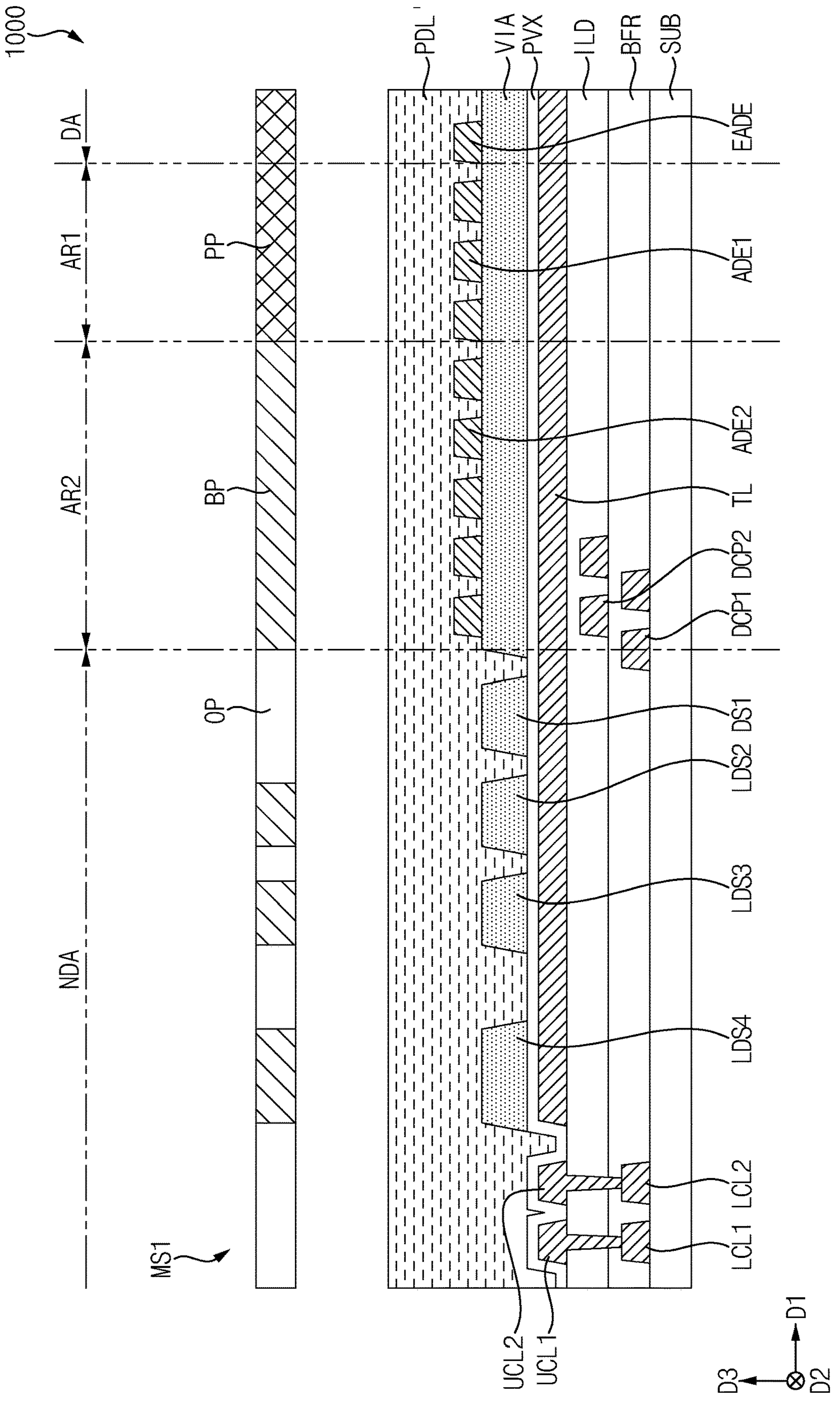
Figure 10:
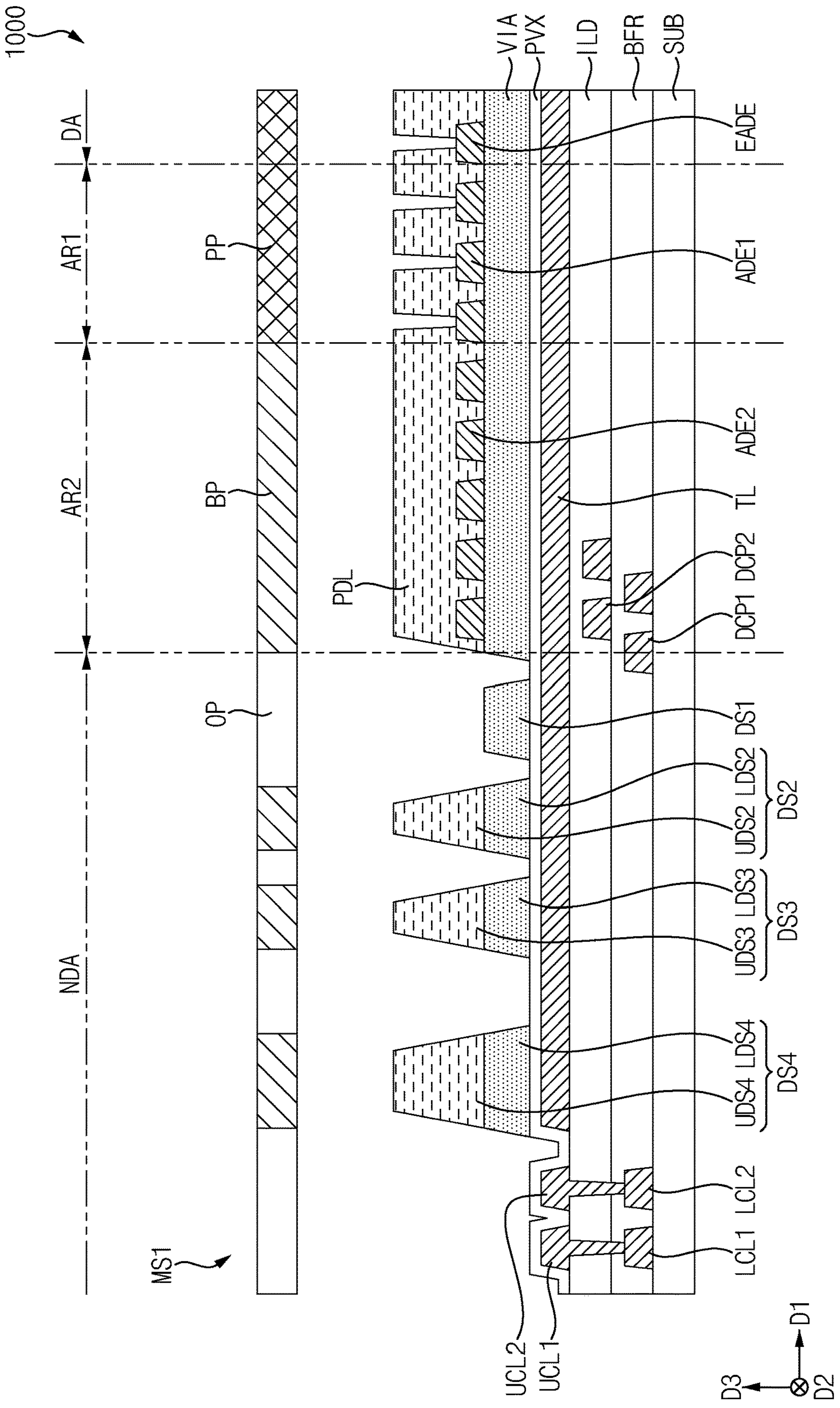

Referring to FIGS. 9 and 10, the preliminary pixel defining layer PDL' may be patterned. In an embodiment, the preliminary pixel defining layer PDL' may be patterned using a first mask MS1, and the pixel defining layer PDL, the second upper structure UDS2, the third upper structure UDS3, and the fourth upper structure UDS4 may be formed together.

In detail, the first mask MS1 may include a pattern portion PP, a blocking portion BP and an open portion OP. The pattern portion PP may overlap the display area DA and the first area AR1, the blocking portion BP may overlap the second area AR2, and the open portion OP may overlap the non-display area NDA. The preliminary pixel defining layer PDL' under the blocking portion BP is not exposed by light, for example, ultraviolet rays ("UV"), exposing the preliminary pixel defining layer PDL' and remains after patterning the preliminary pixel defining layer PDL'.

The pattern portion PP may be aligned to overlap the display area DA and the first area AR1. The pattern portion PP may have a shape corresponding to an opening formed in the pixel defining layer PDL overlapping the display area DA and the first area AR1.

The blocking portion BP may be aligned to entirely overlap the second area AR2. The blocking portion BP may block ultraviolet rays ("UV"). Accordingly, while the preliminary pixel defining layer PDL' is being patterned, the preliminary pixel defining layer PDL' overlapping the second area AR2 may remain without being removed. In addition, the blocking portion BP may further overlap the second to fourth upper structures UDS2, UDS3, and UDS4.

The open portion OP may be aligned to overlap the non-display area NDA except areas in which the second to fourth upper structures UDS2, UDS3, and UDS4 are disposed. The open portion OP may pass ultraviolet ("UV") light. Accordingly, the preliminary pixel defining layer PDL' overlapping the open portion OP may be removed.

Figure 11:
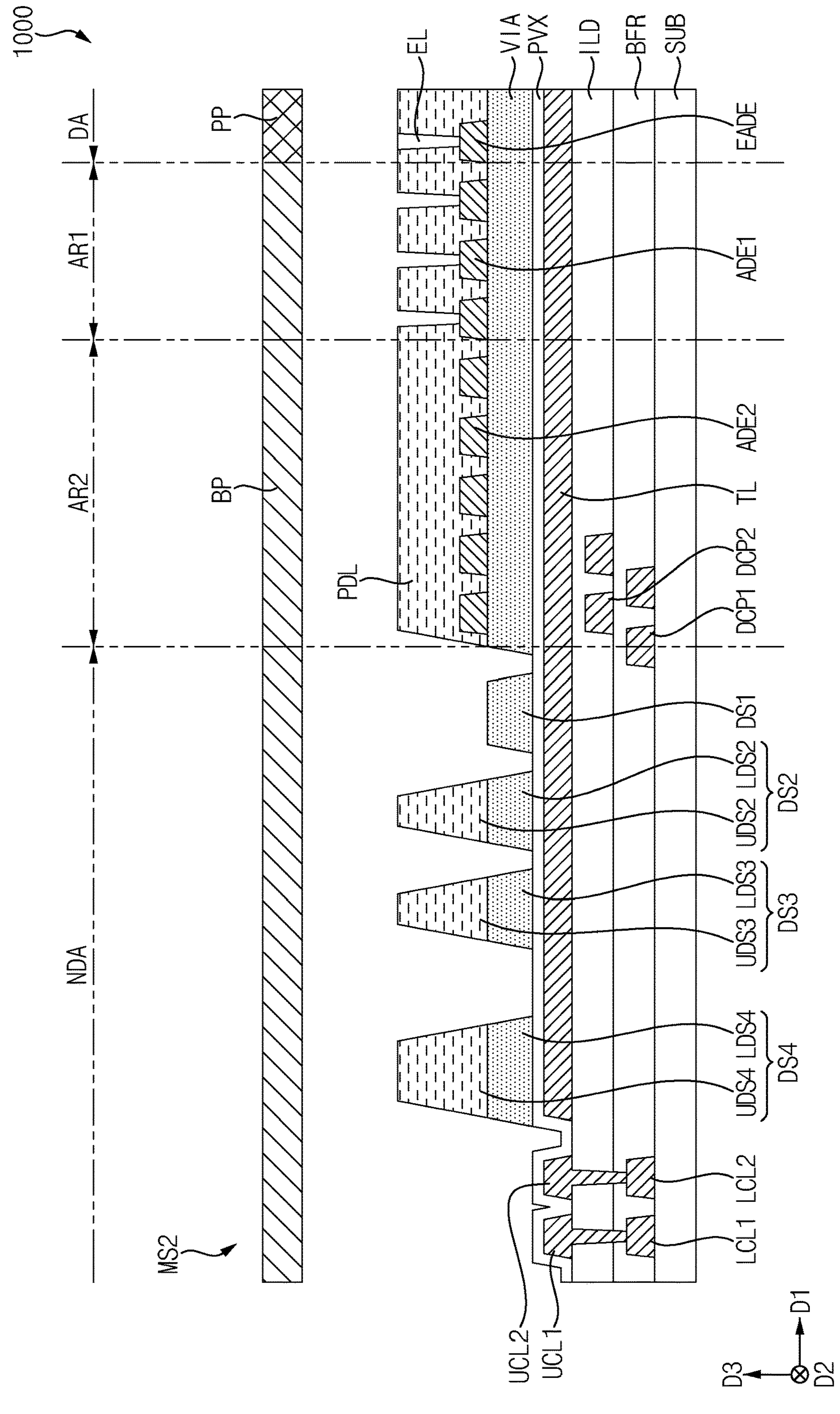

Referring to FIG. 11, the emission layer EL may be formed using a second mask MS2. For example, the second mask MS2 may be a fine metal mask having open portions in areas corresponding to emission layers EL formed in the pixel defining layer PDL overlapping the display area DA.

Figure 12:
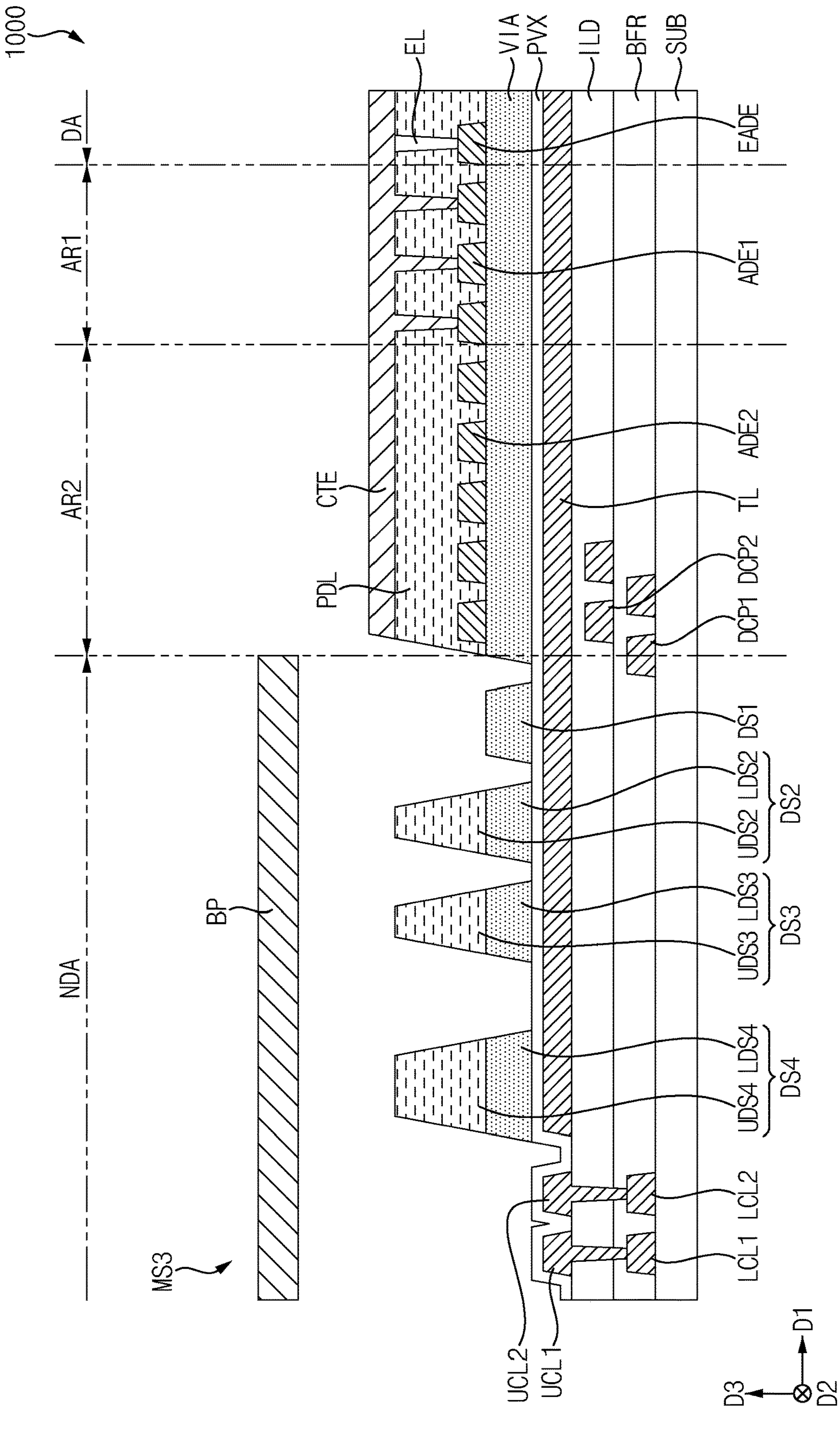

Referring to FIG. 12, the upper electrode CTE may be formed. In an embodiment, the upper electrode CTE may be formed using a third mask MS3.

In detail, the third mask MS3 may be aligned so that the upper electrode CTE is formed in the display area DA, the first area AR1, and the second area AR2. In the process of aligning the third mask MS3, an end of the third mask MS3 may be aligned in the second area AR2. In other words, the second area AR2 may correspond to a misalignment margin area of the third mask MS3. As described above with reference to FIGS. 9 and 10, the pixel defining layer PDL may remain in the second area AR2. Accordingly, the third mask MS3 may not directly contact the second lower pattern ADE2 in the second area AR2, and the peeling defect of the upper electrode CTE overlapping the second area AR2 may be prevented.

Figure 13:
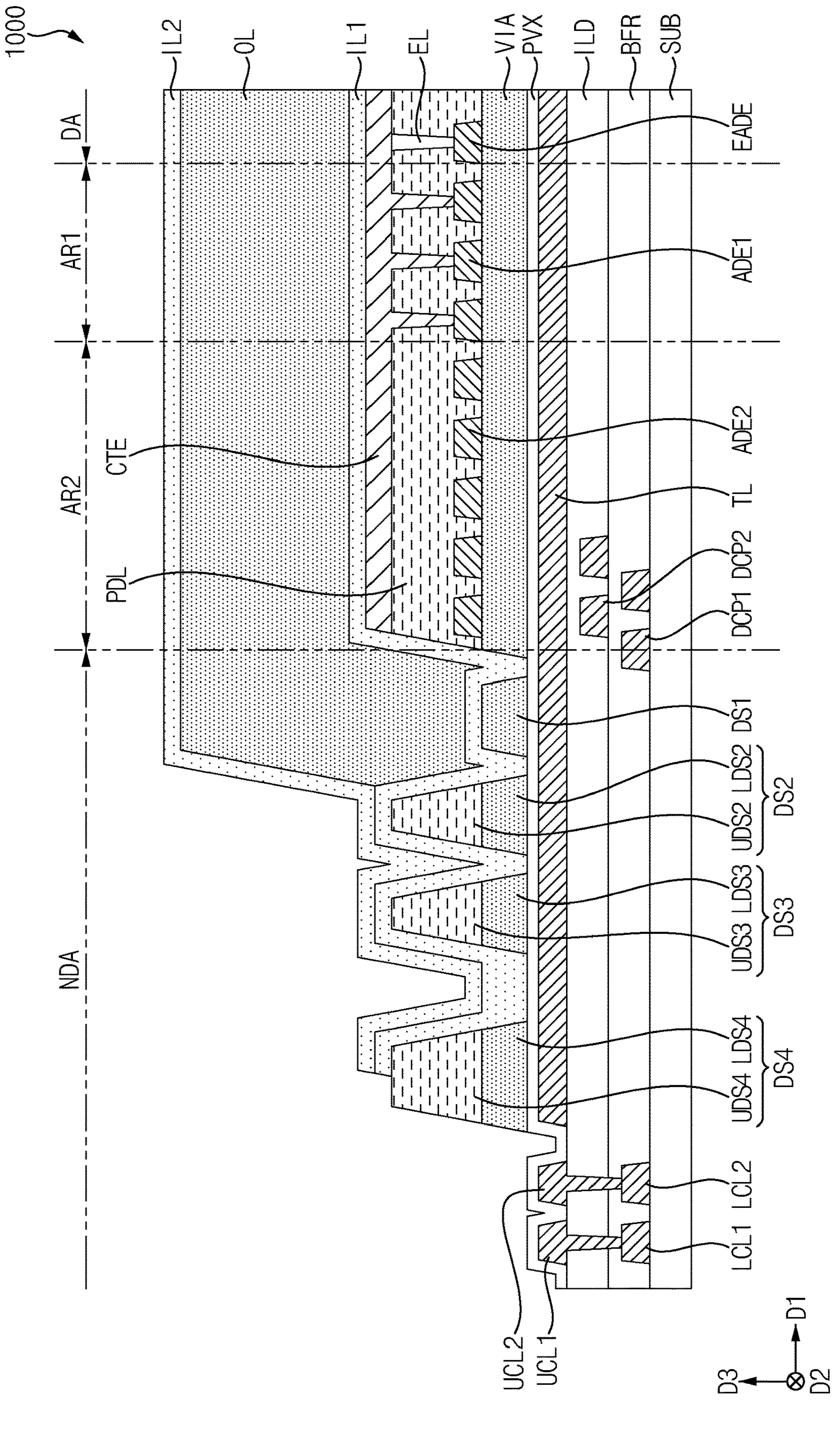

Referring to FIG. 13, the first inorganic layer IL1, the organic layer OL, and the second inorganic layer IL2 may be sequentially formed on the upper electrode CTE.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
an emission lower electrode disposed in a display area on a substrate;
a first lower pattern disposed in a first area adjacent to the display area and disposed in a same layer as the emission lower electrode;
a second lower pattern disposed in a second area adjacent to the first area and disposed in a same layer as the first lower pattern;
an upper electrode disposed on the first lower pattern and the second lower pattern, contacting the first lower pattern in the first area, and overlapping the second lower pattern in the second area;
a first inorganic layer disposed on the upper electrode;
an organic layer disposed on the first inorganic layer; and
a second inorganic layer disposed on the organic layer.

2. The display device of claim 1, wherein the upper electrode doesn't contact the second lower pattern.

3. The display device of claim 1, further comprising:
a pixel defining layer disposed on the first lower pattern and the second lower pattern,
wherein the pixel defining layer does not include an opening in an area overlapping the second lower pattern.

4. The display device of claim 3, wherein the pixel defining layer entirely covers the second lower pattern.

5. The display device of claim 3, wherein the pixel defining layer includes an opening disposed in an area corresponding to the first lower pattern in a plan view.

6. The display device of claim 3, wherein the pixel defining layer includes an opening disposed in an area corresponding to the emission lower electrode in a plan view, and
an emission layer is disposed between the emission lower electrode and the upper electrode.

7. The display device of claim 1, wherein the emission lower electrode, the first lower pattern, and the second lower pattern have a same shape as each other.

8. A display device comprising:
an emission lower electrode disposed in a display area on a substrate;
a first lower pattern disposed in a first area adjacent to the display area and disposed in a same layer as the emission lower electrode;
a second lower pattern disposed in a second area adjacent to the first area and disposed in a same layer as the first lower pattern;
an upper electrode disposed on the first lower pattern and the second lower pattern, contacting the first lower pattern in the first area, and overlapping the second lower pattern in the second area; and
a dam structure disposed in a non-display area adjacent to the second area,
wherein the second lower pattern is disposed between the first lower pattern and the dam structure.

9. The display device of claim 8, further comprising:
a first inorganic layer disposed on the upper electrode;
an organic layer disposed on the first inorganic layer; and
a second inorganic layer disposed on the organic layer.

10. The display device of claim 1, further comprising:
a transistor disposed under the emission lower electrode,
wherein the transistor includes:
a lower metal pattern disposed on the substrate;
an active pattern disposed on the lower metal pattern;
a gate electrode disposed on the active pattern; and
a connection electrode disposed on the gate electrode, and
wherein the emission lower electrode is electrically connected to the active pattern through the connection electrode.

11. The display device of claim 8, wherein the upper electrode doesn't contact the second lower pattern.

12. The display device of claim 8, further comprising:
a pixel defining layer disposed on the first lower pattern and the second lower pattern,
wherein the pixel defining layer does not include an opening in an area overlapping the second lower pattern.

13. The display device of claim 12, wherein the pixel defining layer entirely covers the second lower pattern.

14. The display device of claim 12, wherein the pixel defining layer includes an opening disposed in an area corresponding to the first lower pattern in a plan view.

15. The display device of claim 12, wherein the pixel defining layer includes an opening disposed in an area corresponding to the emission lower electrode in a plan view, and
an emission layer is disposed between the emission lower electrode and the upper electrode.

16. The display device of claim 8, wherein the emission lower electrode, the first lower pattern, and the second lower pattern have a same shape as each other.

17. The display device of claim 8, further comprising:
a transistor disposed under the emission lower electrode,
wherein the transistor includes:
a lower metal pattern disposed on the substrate;
an active pattern disposed on the lower metal pattern;
a gate electrode disposed on the active pattern; and
a connection electrode disposed on the gate electrode, and
wherein the emission lower electrode is electrically connected to the active pattern through the connection electrode.

18. The display device of claim 15, wherein the opening disposed in the area corresponding to the first lower pattern in a plan view and the opening disposed in the area corresponding to the emission lower electrode in a plan view have a same shape.

19. The display device of claim 6, wherein the opening disposed in the area corresponding to the first lower pattern in a plan view and the opening disposed in the area corresponding to the emission lower electrode in a plan view have a same shape.

* * * * *